(12) United States Patent
Kupnicki et al.

(10) Patent No.: US 6,283,778 B1
(45) Date of Patent: Sep. 4, 2001

(54) CIRCUIT BOARD MOUNTING SYSTEM AND RELEASABLE CONNECTOR THEREFOR

(76) Inventors: Richard A. Kupnicki; John Kupnicki, both of 21 Eveningside Road, Markham, Ontario (CA), L3T 4K1; John E. Brook, 31 Nesbitt Drive, Toronto, Ontario (CA), M4W 2G2

(*) Notice: Subject to any disclaimer, the term of this patent is extended or adjusted under 35 U.S.C. 154(b) by 0 days.

(21) Appl. No.: 09/376,318

(22) Filed: Aug. 18, 1999

(30) Foreign Application Priority Data

Apr. 16, 1999 (CA) .................................................. 2269136

(51) Int. Cl.[7] ............................ H01R 13/15; H01R 13/62
(52) U.S. Cl. ........................................ 439/260; 361/730
(58) Field of Search ....................... 439/61, 260; 361/730

(56) References Cited

U.S. PATENT DOCUMENTS

| | | | |
|---|---|---|---|
| 3,764,857 | * 10/1973 | Bartlett et al. ...................... | 361/681 |
| 3,915,307 | * 10/1975 | Agarde .............................. | 211/41.17 |
| 4,080,027 | * 3/1978 | Benasutti ........................... | 439/260 |
| 4,556,268 | * 12/1985 | Noschese ........................... | 439/267 |
| 4,574,332 | 3/1986 | Calabro ............................. | 361/413 |
| 4,648,668 | * 3/1987 | Sinisi ............................... | 439/267 |
| 4,685,032 | 8/1987 | Blomstedt et al. .................. | 361/412 |
| 4,705,338 | * 11/1987 | Sitzler .............................. | 439/260 |
| 4,845,589 | 7/1989 | Weidler et al. ..................... | 361/342 |
| 4,861,274 | 8/1989 | Brune et al. ....................... | 439/189 |
| 5,388,995 | * 2/1995 | Rudy, Jr. et al. .................... | 439/61 |
| 5,402,320 | * 3/1995 | Kielstra et al. ..................... | 361/796 |
| 5,564,930 | * 10/1996 | Yu ................................... | 439/61 |
| 5,708,563 | * 1/1998 | Cranston, III et al. ............... | 361/683 |
| 5,788,509 | * 8/1998 | Byers et al. ........................ | 439/61 |

FOREIGN PATENT DOCUMENTS

| | | | |
|---|---|---|---|
| 32 30 281 A1 | 4/1983 | (DE) .............................. | H05K/7/14 |
| 33 40 334 A1 | 5/1985 | (DE) .............................. | H05K/7/18 |

* cited by examiner

*Primary Examiner*—Brian Sircus
*Assistant Examiner*—Hae Moon Hyeon

(57) ABSTRACT

A modular mounting system which allows a circuit board to be removed, inserted or replaced through the front of the mounting frame without deactivating power to the equipment, and in the preferred embodiment without detaching any external cables. Connections for external equipment are disposed along the rear edge of the circuit board, and a row of contacts for the internal connections is provided along the bottom edge of the circuit board. The system of the invention provides a releasable connector which retracts the connector pins into a housing when a circuit board is inserted or removed, thus eliminating the possibility of a contact on the circuit board touching a live connector pin. In the preferred embodiment the external connections are made through adaptors that plug into external cable connectors provided on a connector plate detachably affixed to the rear of the mounting frame. In the preferred embodiment the invention provides an actuating mechanism for the releasable connector which must be actuated in order to remove a circuit board, thus ensuring that the connector pins have disengaged from the circuit board contacts before a circuit board is moved. The mounting system of the invention achieves a high packaging density for mounted devices and accommodates any input/output format. The invention also permits use of two or more separate circuit boards for a device residing in the same compartment and connected by an interface, which allows circuit boards to be repaired or upgraded by replacing a portion of the device circuitry. The invention also provides a novel system for cooling the mounting frame, providing heat sink tunnels in the impeller airstream and affixing the most significant heat-generating components to the heat sink tunnels. The impeller draws an intake airstream through a low resistance path within the mounting frame to cool the circuit board components.

14 Claims, 12 Drawing Sheets

FIG. 2.
FIG. 5.
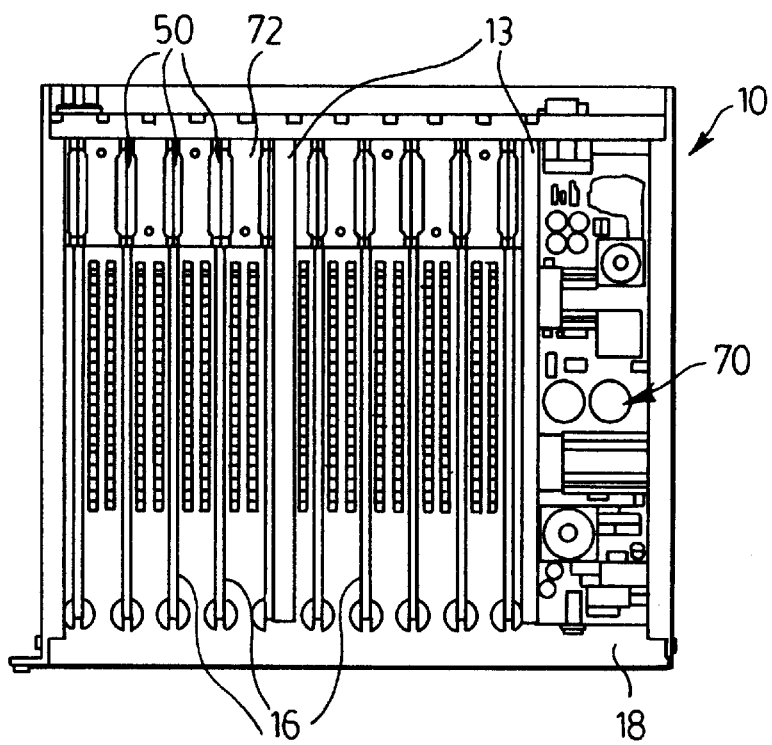
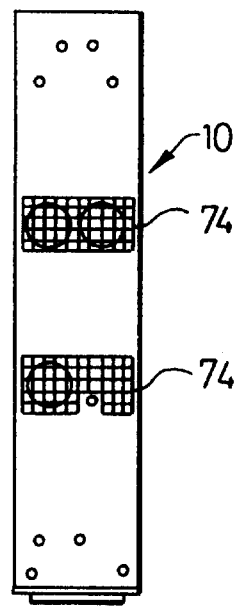
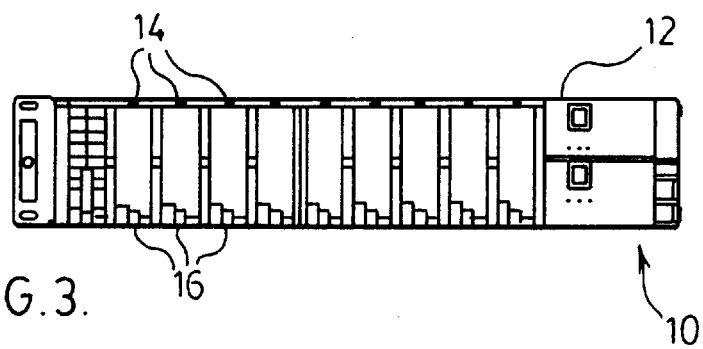
FIG. 3.
FIG. 4.
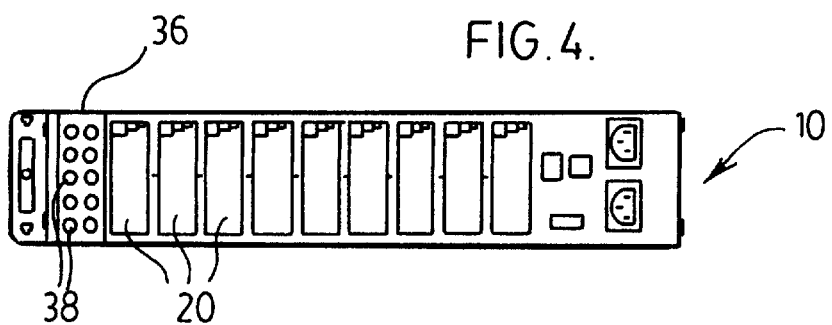

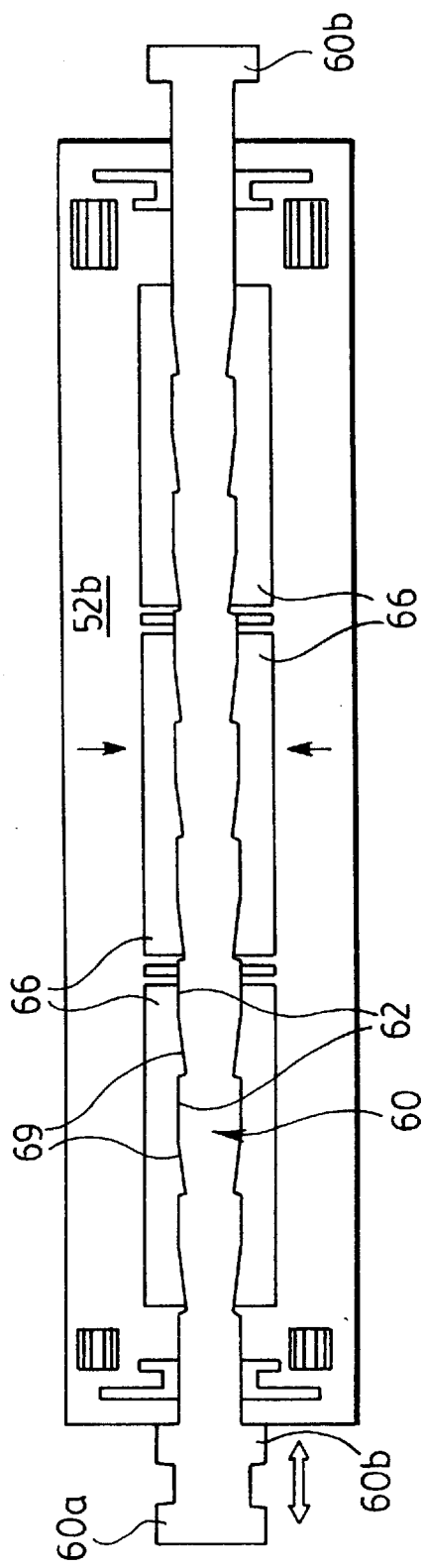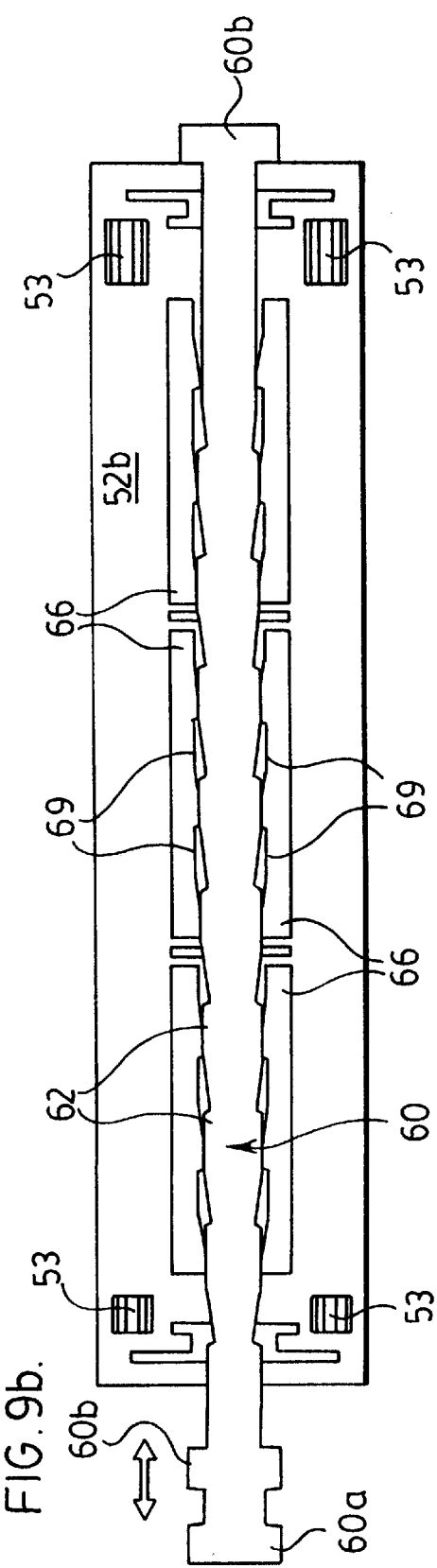
FIG. 9a.
FIG. 9b.

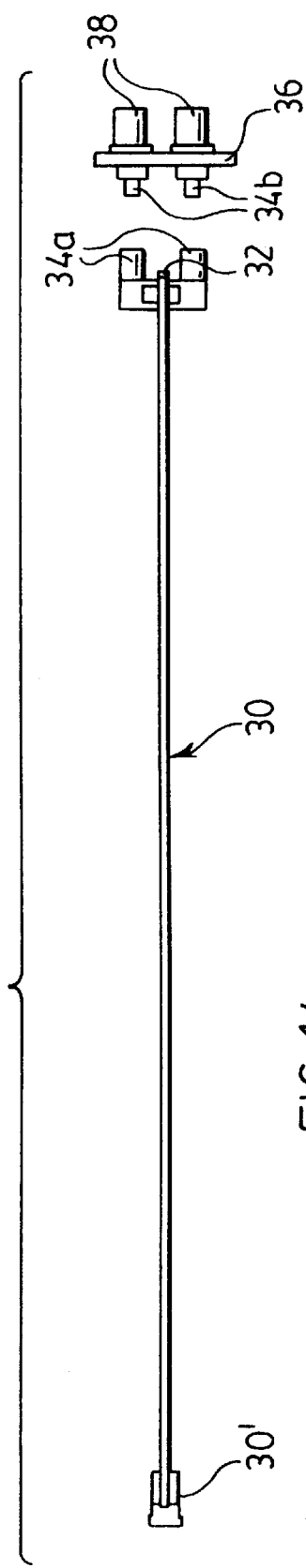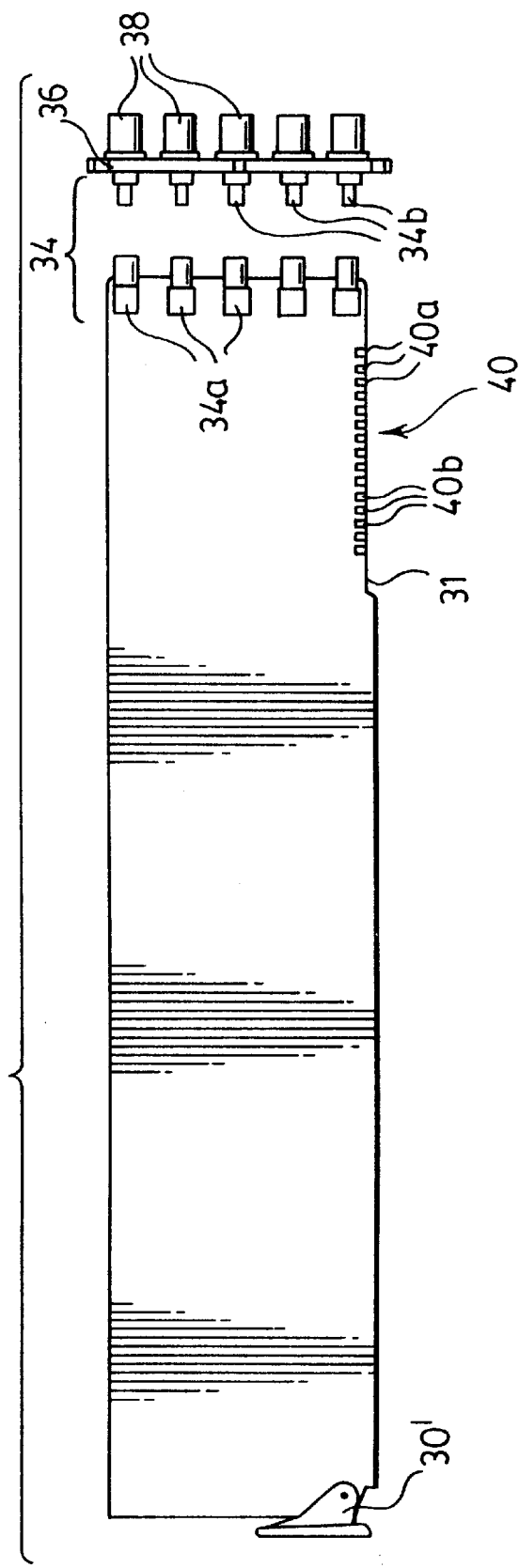

CIRCUIT BOARD MOUNTING SYSTEM AND RELEASABLE CONNECTOR THEREFOR

FIELD OF THE INVENTION

This invention relates to mounting systems and connectors for electronic circuit boards. In particular, this invention relates to a mounting system for mounting into a frame electronic circuit boards requiring cable connection to external devices, and a releasable connector suitable for use with such a mounting system.

BACKGROUND OF THE INVENTION

Many types of sophisticated electronic equipment utilize modular circuit boards mounted into a housing or mounting frame. The mounting frame provides a secure enclosure which protects the delicate circuit components and organizes the various circuit boards within a compact space.

For example, many of the different devices utilized in audio/video broadcasting are built into circuit boards that are mounted into one or more mounting frames in, for example, a television broadcast studio or post-production facility. Each circuit board is provided with circuitry designed to perform the particular function(s) of the device. In the case of audio/video equipment these might include distribution amplifiers, routing switchers, sync pulse and test signal generators, time code readers, logo generators, analog-to-digital converters etc.

In such applications the circuitry on each circuit board requires both internal connections for interfacing with power supplies and other circuit boards, and external connections for interfacing with external devices. These connections are typically detachable to provide a modular design. Each circuit board is supported in a compartment within the mounting frame. Typically internal connections include communications busses for high speed data communication between circuit boards within the mounting frame, and power conductors for supplying power to the circuit boards, often from multiple power supplies operating at different voltage levels. These busses and conductors can be supported on a board or "back plane" extending across the mounting frame through the circuit board compartments.

External connections typically include standard cable connectors for the detachable connection of cables transmitting signals to, or receiving signals from, external equipment such as cameras, receivers, mixers, computers etc. The rear edge of each circuit board is exposed through an opening in the rear of the mounting frame, and thus the cable connectors for external connections are fastened along the rear edges of the circuit boards so as to be accessible.

In conventional mounting systems rectangular circuit boards for each device are mounted in the mounting frame by sliding circuit boards lengthwise into the front of the mounting frame, into channels or tracks disposed along each compartment. A row of contacts along the rear edge of the circuit board mates with a connector supported on the front face of the back plane, to establish the internal connections. Typically the external cable connectors are affixed along the rear edge of a separate circuit board which is inserted into the rear of the mounting frame, the front edge of which supports a row of contacts that mate with a connector supported on the rear face of the back plane, to establish a connection between the rear circuit board and the front circuit board. This type of system is well known to those skilled in the art.

However, the various devices utilized in such electronic equipment are subject to breakdown, upgrading, changes in system requirements and other circumstances which require that a circuit board be removed from the mounting frame and replaced with another circuit board. In conventional equipment this requires that power to the mounting frame be deactivated, to avoid the possibility of a live conductor contacting a conductor on the circuit board and damaging the delicate components of the circuit during removal or insertion. Further, all of the cable connections to the affected device must be disconnected before the rear portion of the circuit board can be removed, because the cable connectors are attached to the circuit board.

In order to provide a conventional connector for the internal connections such as data busses and power conductors, the contacts for these internal connections are provided along the Tear edge of the circuit board (which is the leading edge as the board is mounted into the mounting frame), so that the contacts approach the connector in the direction of insertion of the board. However, it is desirable to provide as many external cable connectors as possible within the limited space along the rear edge of each circuit board, which does not leave room along the rear edge for contacts for the internal connections. Size constraints do not permit the rear edge of the circuit board to be lengthened to accommodate internal connections, because space is used very sparingly in such facilities.

The internal data busses and power conductors can be connected to a row of contacts along the bottom edge of the circuit board. It is possible to wire a multi-pin connector in alignment with the track, so that when the circuit board is fully inserted into a compartment the connector pins align with the appropriate contacts along the bottom edge of the circuit board. However, this would still require that the power be deactivated before a circuit board is removed, to prevent a data or low power contact brushing past a live power supply pin. Further, the cables connected to the cable connectors along the rear edge of the circuit board must all be detached in order to remove the circuit board.

This presents a problem when a circuit board must be replaced while the equipment is in use, and a significant inconvenience when upgrading or changing circuit boards during equipment down-times.

The present invention overcomes these disadvantages by providing a modular mounting system which allows a circuit board to be removed, inserted or replaced through the front of the mounting frame without deactivating power to the equipment, and in the preferred embodiment without detaching any external cables. The mounting system of the invention achieves a high packaging density for mounted devices and accommodates any input/output format.

In the mounting system of the invention connections for external equipment are disposed along the rear edge of the circuit board, and a row of contacts for the internal connections is provided along the bottom edge of the circuit board. The system of the invention provides a releasable connector which retracts the connector pins into a housing when a circuit board is inserted or removed, thus eliminating the possibility of a contact on the circuit board touching a live connector pin. In the preferred embodiment the external connections are made through adaptors that plug into the external cable connectors, which are provided on a separate plate detachably affixed to the rear of the mounting frame.

In the preferred embodiment the invention provides an actuating mechanism for the releasable connector which must be actuated in order to remove a circuit board, thus ensuring that the connector pins have disengaged from the circuit board contacts before a circuit board is moved.

In another preferred embodiment the invention permits use of two or more separate circuit boards for a device, residing in the same compartment and connected by an interface, which allows circuit boards to be repaired or upgraded by replacing a portion of the device circuitry.

The invention also provides a novel system for cooling the mounting frame, providing heat sink tunnels in the impeller airstream and affixing the most significant heat-generating components to the heat sink. The impeller draws an intake airstream through a low resistance path within the mounting frame to cool the circuit board components, the most problematic heat-generating components on the circuit boards preferably being positioned directly in the path of the impeller intake.

The present invention thus provides a circuit board mounting system for mounting at least one circuit board, comprising a mounting frame having at least one compartment, the compartment having at least a first track for slidably receiving a circuit board, at least one opening through an end of the mounting frame for exposing a rear end of the circuit board supporting at least one external connector, and an internal connector disposed in alignment with the track for engaging against at least one contact disposed adjacent to an edge of the circuit board adjoining the rear edge, wherein when the circuit board is inserted into the compartment the at least one contact is coupled to the internal connector and the external connector is accessible through the opening in the mounting frame.

The present invention further provides a releasable connector for coupling at least one pin to at least one contact on a circuit board, comprising a housing to which the pin is mounted, and a receiving portion adapted receive an edge of a circuit board, a contact arm of the pin being movable between a closed position in which at least portion of the pin impinges into the receiving portion and an open position in which the contact arm is retracted from the receiving portion, and means for moving the contact pin between the open position and the closed position.

In a further aspect of the invention the connector is provided with a plurality of pins, each pin having a contact arm movable between the closed and open positions, and the means for moving the contact arms comprises a cam strip disposed longitudinally through the housing having cams extending toward the contact arms, wherein by moving the cam strip longitudinally in one direction the cams depress the contact arms to the open position, and by moving the cam strip longitudinally in another direction the contact arms return to the closed position.

The present invention further provides a circuit board mounting system, comprising a circuit board having a rear end supporting at least one external connector comprising a first adaptor portion, a mounting frame having at least one compartment, the compartment having at least one track for slidably receiving a circuit board, at least one opening through a first end of the mounting frame for exposing the rear end of the circuit board, and a connector plate supporting at least one cable connector on an exterior face and supporting at least one second adaptor portion on an interior face electrically coupled to the cable connector, the connector plate being disposed over the opening, wherein when the circuit board is mounted into the mounting frame through a second end opposite the first end, the first adaptor portion is coupled to the second adaptor portion to electrically couple an electrical circuit supported by the circuit board to the cable connector.

The present invention further provides an electronic device, comprising a first circuit board supporting a first portion of a circuit for the device, a second circuit board supporting a second portion of a circuit for the device, and a rigid interface adaptor electrically coupling the first circuit board to the second circuit board, wherein the interface adaptor maintains the first circuit board in substantially rigid alignment with the second circuit board to form an integral circuit board.

The present invention further provides a circuit board for an electronic device adapted to be mounted in a mounting frame, having at least one internal connector for electrical connection to at least one other circuit board in the mounting frame and at least one external connector for electrical connection to at least one device external to the mounting frame, wherein the internal connector is disposed adjacent to a first edge of the circuit board and the external connector is disposed adjacent to a second edge adjoining the first edge.

BRIEF DESCRIPTION OF THE DRAWINGS

In drawings which illustrate by way of example only a preferred embodiment of the invention, FIG. 2 is a top plan view of the mounting frame of FIG. 1, FIG. 3 is a front elevation of the mounting frame of FIG. 1, FIG. 4 is a rear elevation of the mounting frame of FIG. 1, FIG. 5 is a side elevation of the mounting frame of FIG. 1, FIG. 9a is a cutaway plan view of a cam strip for the releasable connector of FIG. 6 in a closed position, FIG. 9b is a cutaway plan view of a cam strip for the releasable connector of FIG. 6 in an open position, FIG. 13 is a top plan view of the circuit board of FIG. 12, FIG. 14 is a side elevation of the circuit board of FIG. 12.

DETAILED DESCRIPTION OF THE INVENTION

Figure 1:
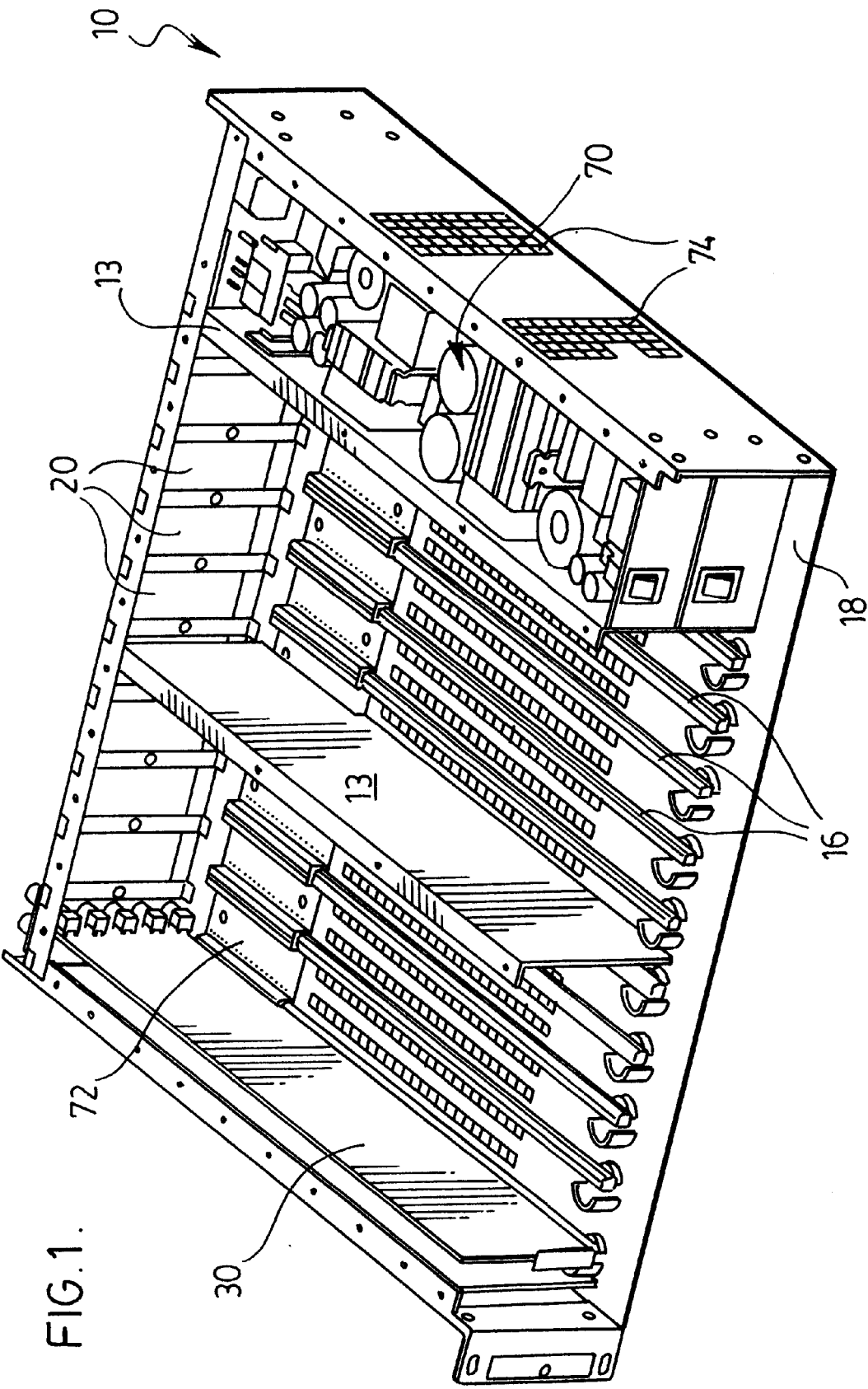
FIG. 1 is a perspective view of a first preferred embodiment of a mounting frame embodying the circuit board mounting system of the invention.
Figure 6:
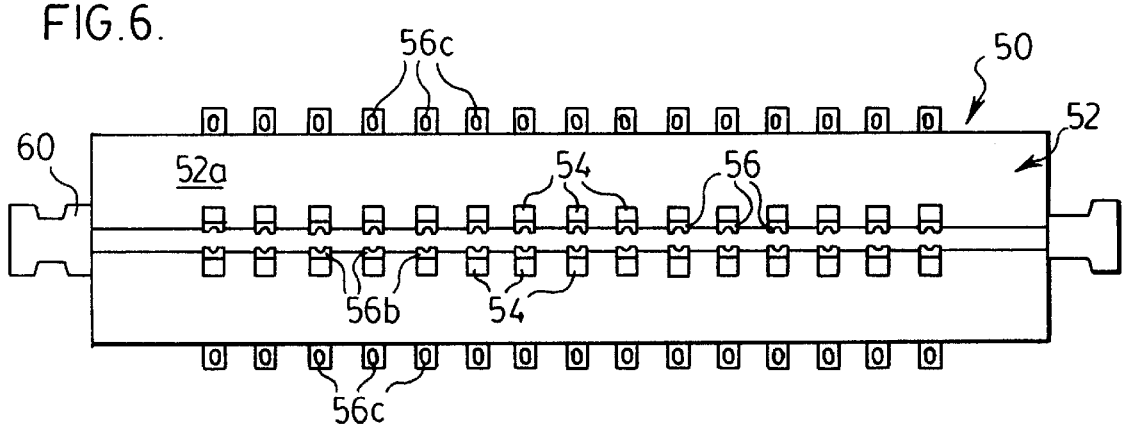
FIG. 6 is a top plan view of a preferred embodiment of a releasable connector for the circuit board mounting system of the invention.
Figure 7:
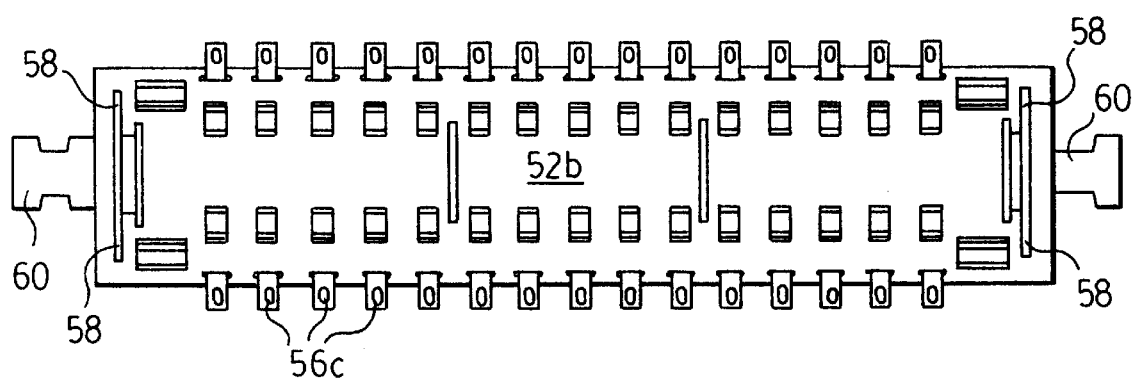
FIG. 7 is a bottom plan view of the releasable connector of FIG. 6.
Figure 8:
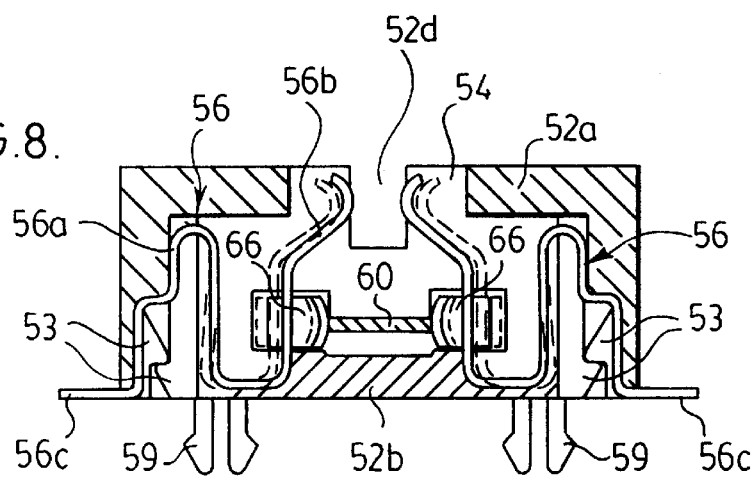
FIG. 8 is a cross-sectional end elevation of the releasable connector of FIG. 6 showing the open and closed positions of the connector.

As illustrated in FIGS. 1 to 5, a first preferred embodiment of the mounting frame 10 according to the invention contains evenly spaced sets of opposed slotted channels or tracks 14, 16, forming compartments for the circuit board 30. An end compartment 18 contains a chassis 70 supporting the power supplies and other high heat-generating components, and the cooling system, as described in detail below. One or more dividers 13 may be provided at intermediate positions within the mounting frame 10, to isolate compartments (for example the compartment 18 housing chassis 70) and to support the top panel 12 to which tracks 14 are affixed (shown only in FIG. 3).

Figure 12:
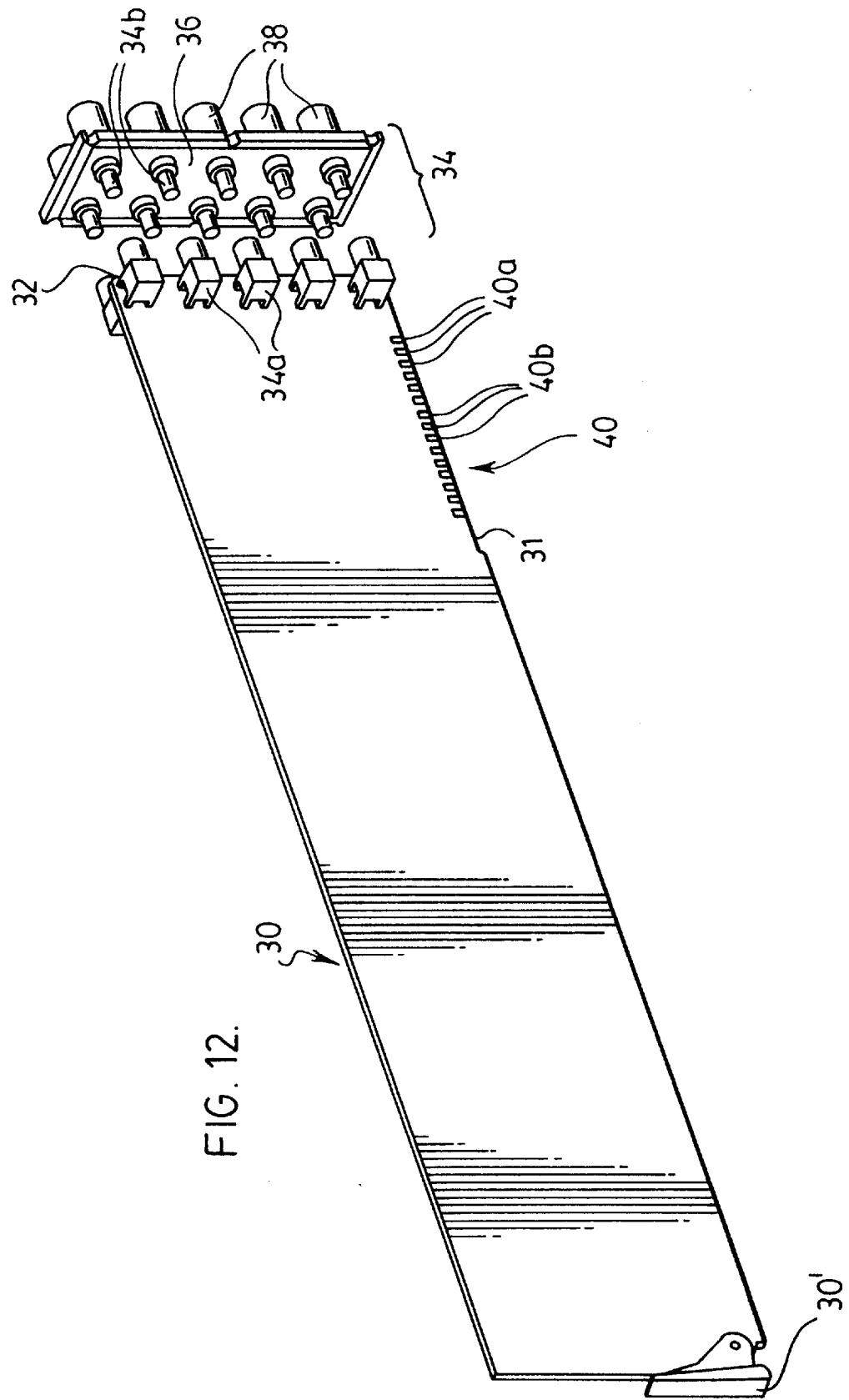
FIG. 12 is a perspective view of a preferred embodiment of a circuit board for the circuit board mounting system of the invention.
Figure 15:
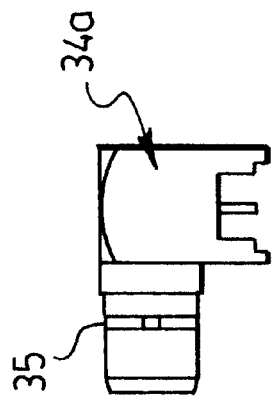
FIG. 15 is an enlarged plan view of a preferred external connector for mounting on the circuit board of FIG. 12.

The circuit board 30 is illustrated in FIG. 12. The circuit board 30 has a rear edge 32 supporting a row of external connectors coupled to the device embodied in the circuit (not shown) supported on the circuit board 30. In the preferred embodiment each external connector comprises the first end 34a of an adaptor 34, for example one end of an SMB coaxial connector, illustrated in FIG. 15.

The first end 34a connects to a second end 34b mounted on a connector plate 36 which is affixed over an opening 20 in the rear of the mounting frame 10. The connector plate 36 supports at least one row of the external connectors, preferably two vertical rows as shown in FIGS. 12 and 13 to maximize the number of available cable connections, facing the interior of the mounting frame 10. On the exterior face of the connector plate 36 cable connectors 38, for example BNC type coaxial cable connectors, are coupled to the second ends 34b of the adaptor 34. External analog and digital signals are thus communicated to and from the circuit board 30 when the ends 34a, 34b of the adaptor 34 are coupled together. The ends 34a, 34b may be chamfered and flared, respectively, to allow for blind coupling of the adaptor 34 with some tolerance for misalignment during insertion of the circuit board 30.

In the preferred embodiment the first end 34a is provided with a compressible snap ring 35 which provides a snap-fit engagement into a groove (not shown) formed in the second end 34b. The adaptor 34 is coupled to a BNC connector 38 by way of example, however it will be appreciated that any other type of cable interface can be used to connect the device to external equipment. Examples of some other types of connectors are illustrated in FIGS. 23a to 23d. The connectors 38, 39 and adaptor 34 should be suitable for the type of signals intended to be communicated between the external devices and the circuit board 30.

A row of contacts 40 extends along one long edge of the circuit board 30 abutting the rear edge 32. In the embodiment illustrated in FIG. 12 the contacts 40 are disposed along the bottom edge 31, which is recessed slightly to accommodate the height of the connector 50 described below. The contacts 40, preferably disposed near the rear edge 32, may comprise one or more power supply connections 40a for supplying power to the circuit at the various voltage levels required by the device, which may include a ground, and data connections 40b which connect the circuit to other devices within the mounting frame 10, for example for high speed data transmission therebetween.

In alignment with the rear end of the track 16 is a connector 50. The connector 50 in the preferred embodiment is a releasable connector, or "zero insertion force" (ZIF) connector, in which the connector can be disengaged from the contacts of the circuit board 30 for insertion or removal. A preferred embodiment is illustrated in FIGS. 6 to 9.

The connector 50 of the invention comprises a housing 52, preferably plastic, with openings 54 through which the connector pins 56 project when the connector 50 is closed. The pins 56 are mounted in any suitable fashion to the bottom 52b of the housing 52, which in turn is secured to the mounting frame 10 as by clips 59 or by any other suitable means. A top portion 52a of the housing may be connected to the bottom 52b as by barbed latches 53, or in any other suitable fashion, and comprises a slot 52d (shown in FIG. 8) into which the bottom edge 31 of the circuit board 30 nests when the circuit board 30 is mounted in the connector 50.

The pins 56 each preferably comprise a spring loop 56a for improved flexibility and resistance to metal fatigue, and a contact arm 56b configured and spring biased to provide a stable connection with a contact 40 on the circuit board 30.

The pins 56 are connected (e.g. soldered) to the data busses and power conductors (not shown) extending throughout the mounting frame 10 at terminals 56c. The contact arms 56b are disposed in opposed rows along the insertion path of the circuit board 10, as defined by the track 16, impinging into the slot 52d, to connect these data busses and power conductors to the appropriate contact 40a or 40b on the circuit board 30. In the embodiment illustrated the circuit board 30 has electrically independent contacts 40 disposed along both sides of the bottom edge 31, and the connector 50 is thus provided with opposed rows of pins 56 corresponding thereto. Preferably the rows of pins 56 are spaced apart so that opposing contact arms 56b cannot touch one another if the connector 50 is closed with no circuit board 30 in the connector 50. The circuit board 30 may alternatively have contacts 40 only along one side of the edge 31, in which case a single row of pins 56 will be sufficient. In either case, preferably the contacts 40 are spaced apart a distance greater than the width of a contact arm 56b, so that in case of misalignment of the circuit board 30 in the connector 50 the contact arm 56b cannot short circuit adjacent contacts 40.

A cam strip 60, preferably formed from a low-friction plastic and having opposed laterally extending cams 62 in a saw-tooth pattern, is slidably disposed through a channel 58 in the housing 52. The cam strip 60 is configured so that the cams 62 depress the contact arm 56b of each pin 56 to an open position, shown in phantom lines in FIG. 8, and recede when shifted longitudinally to a closed position so that the contact arms 56b return to a rest position, as shown in solid lines in FIG. 8. To prevent frictional contact between the cam strip 60 and the contact arms 56b, in the preferred embodiment a gang strip 66, also preferably formed from low-friction plastic, is disposed along each row of contact arms 56b to move the entire row of contact arms 56a as a unit. The gang strip 66 has cam surfaces 69 complimentary to the cams 62 on the cam strip 60, to move the rows of contact arms 56b as the cam strip 60 is moved longitudinally in the channel 58 between the closed and open positions, respectively illustrated in FIGS. 9a and 9b.

It is also possible to move the contact arms 56b differentially, for example to disengage a power pin before disengaging the ground pin, by providing independent cam surfaces 69 actuating one or more specific contact arms 56b and having different cam angles, or providing different cam angles to the cams 62 of the cam strip 60. It will be appreciated that the gang strip 66 will prolong the life of the connector 50 by eliminating frictional contact between the cam strip 60 and the contact arms 56b, however it is not necessary to the operation of the connector 50 and the cam strip 60 can be designed to depress the contact arms 56b by direct contact.

Thus, when the cam strip 60 is in the open position the cams 62 depress the gang strips 66 in the direction shown by the arrows in FIG. 9b, which in turn force the contact arms 56b to retract into the housing 52. Preferably there is no portion of any pin 56 projecting from the housing 52 in the open position. When the cam strip 60 is moved to the closed position, the resilience of the pins 56 causes the contact arms 56b to move in the direction shown by the arrows in FIG. 9a back to the rest position where, when a circuit board 30 is connected to the connector 50, the contact arms 56b couple the back plane circuitry to the circuit board 30 through contacts 40a, 40b. The cam strip 60 preferably comprises shoulders 60b which limit the motion of the cam strip 60 within the housing 52.

Figure 11:
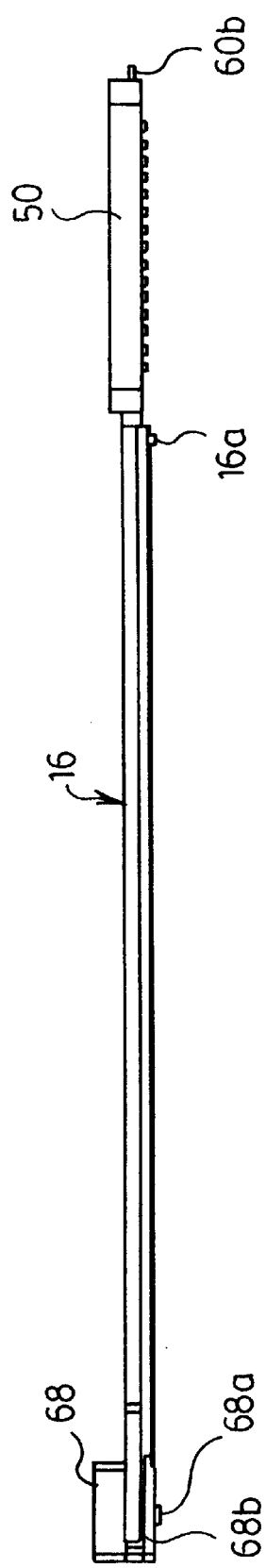
FIG. 11 is a side elevation of the track of FIG. 10.

In the preferred embodiment the track 16 is used to actuate the cam strip 60 of the connector 50 in each compartment. In the embodiment of FIG. 11 the track 16 is mounted to the floor of the mounting frame 10 by pins 16a engaging into slots (not shown), or is otherwise slidably affixed to the mounting frame 10, such that the track can move longitudinally along the compartment with a limited degree of motion.

Figure 18:
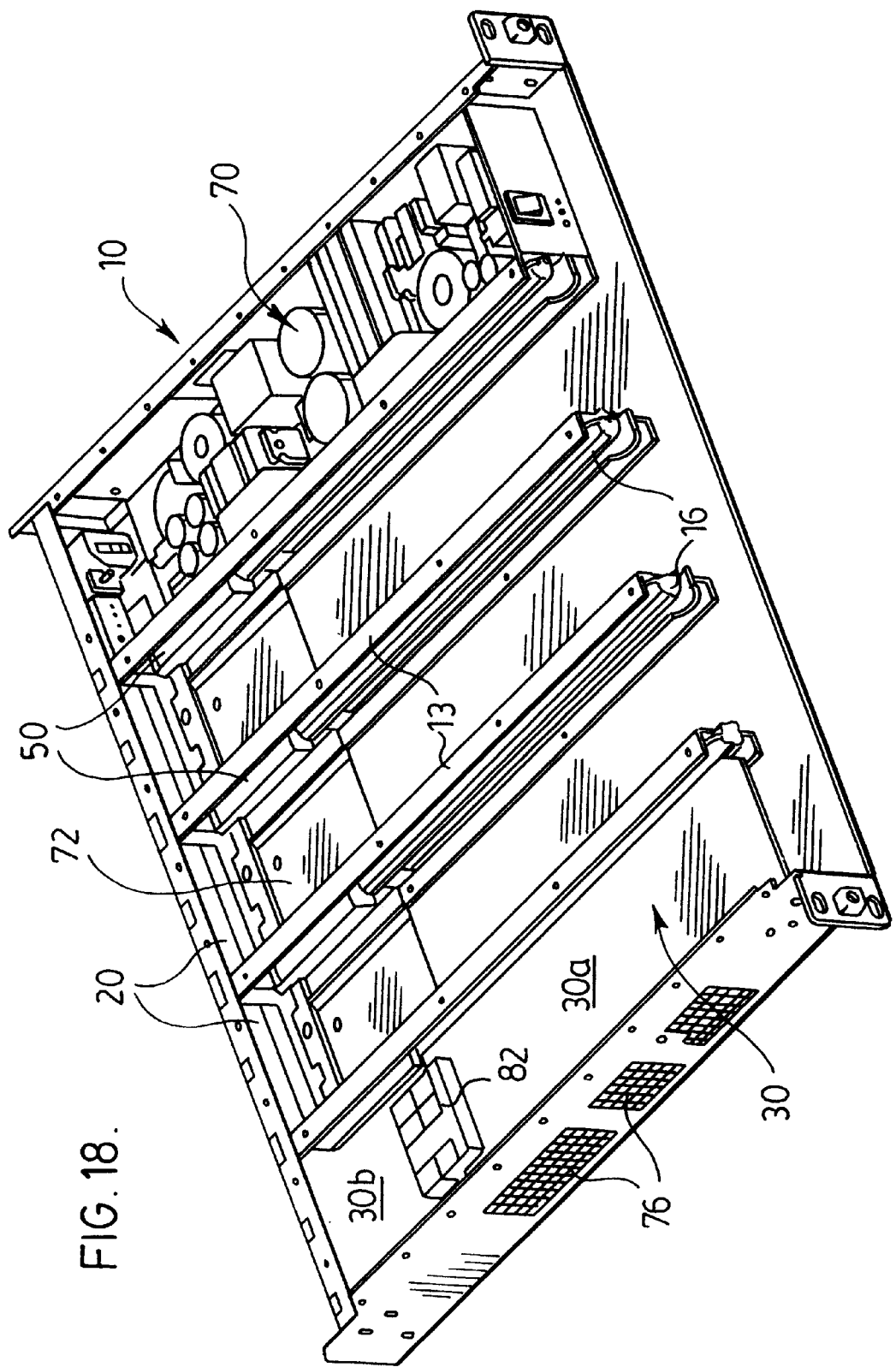
FIG. 18 is a perspective view of a further preferred embodiment of a mounting frame embodying the invention.

FIG. 18 illustrates an alternative embodiment of the mounting frame 10 in which the compartments are adapted for mounting the circuit boards 30 horizontally, in which case the tracks 14, 16 are provided along dividers 13 between the compartments. Vents 76 are provided along the side opposite the chassis 70 for providing an intake airstream to cool the circuit boards 30. The principles of this embodiment are otherwise the same as in the embodiment of FIG. 12.

Figure 10:
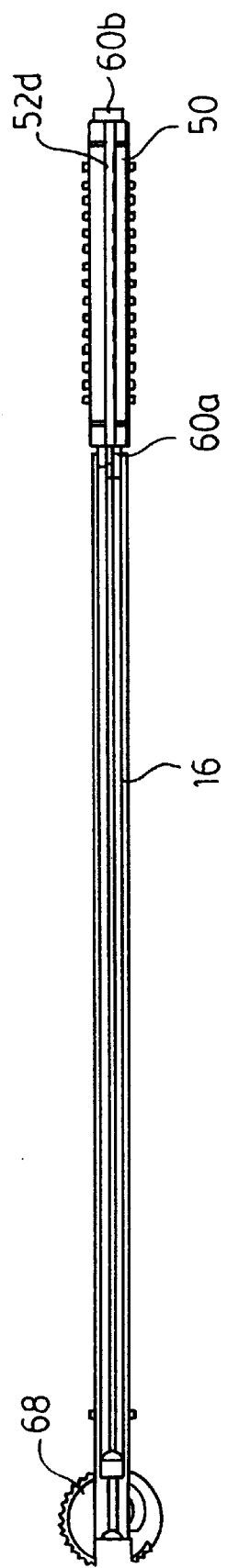
FIG. 10 is a top plan view of a movable track for actuating the releasable connector of FIG. 6.

The front end of the cam strip 60, which is provided with an enlargement 60a, is lodged in the rear end of the track 16, as shown in FIGS. 10 and 11. Thus, the track 16 forms an actuator for the connector 50. Preferably the track 16 is in turn actuated by a knob 68 or other obstructing member which is rotationally mounted as by a pin 68a and protrudes into the path of the circuit board 30 unless the knob 68 is turned to the open position, to thus prevent movement of the circuit board 30 unless the connector 50 is in the open position. Rotation of the knob 68 pulls the track 16 via eccentric linkage 68b and thus draws the cam strip 60 to the open position.

In operation, where a circuit board 30 is to be replaced the knob 68 is rotated to both release the front edge of the circuit board 30 and pull the track 16, which draws the cam strip 60 to the open position. The cams 62 coacting with the cam surfaces 69 of the gang strips 66 depress the contact arms 56b of the pins 56, which retract into the housing 52. The circuit board 30 can then be removed by manually grasping the pull tab 30' at the front of the circuit board 30 and pulling the circuit board 30 out of the compartment, which draws the external connectors 34a out of the mating adaptor portion 34b.

A new circuit board 30 can then be inserted into the tracks 14, 16. As the circuit board is slid into position the first ends 34a contact and are depressed into the second ends 34b, connecting the circuit board 30 to the cable connectors 38 and/or 39. When the circuit board 30 has been fully inserted the knob 68 is turned to block movement of the circuit board 30, at the same time pushing the track 16 which in turn pushes the cam strip 60 to the closed position shown in FIG. 9a. The resilient action of the spring loop 56a pushes the contact arms 56b onto the contacts 40a, 40b, to connect the device to the back plane circuitry running through the mounting frame 10.

Figure 16:
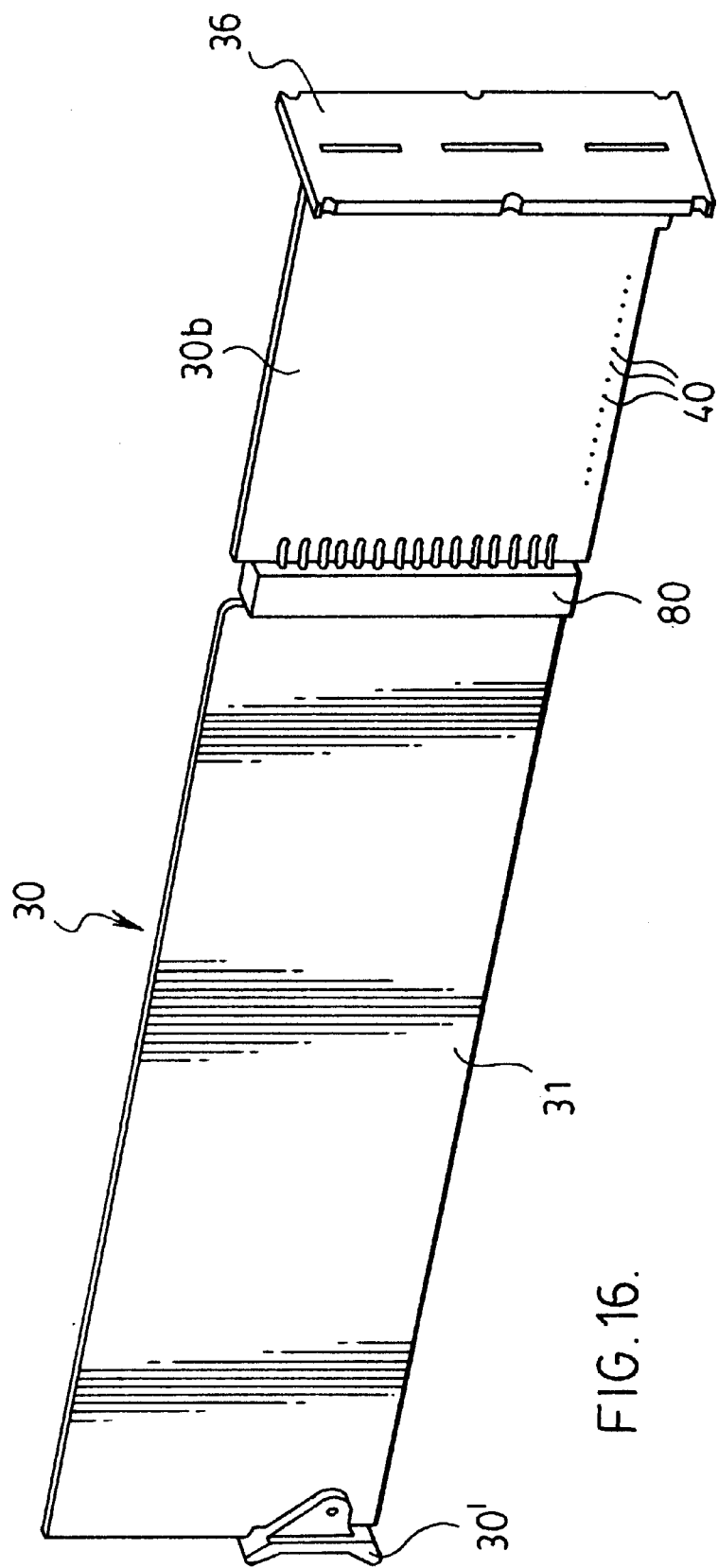
FIG. 16 is a perspective view of a further preferred embodiment of a circuit board for the circuit board mounting system of the invention.
Figure 17:
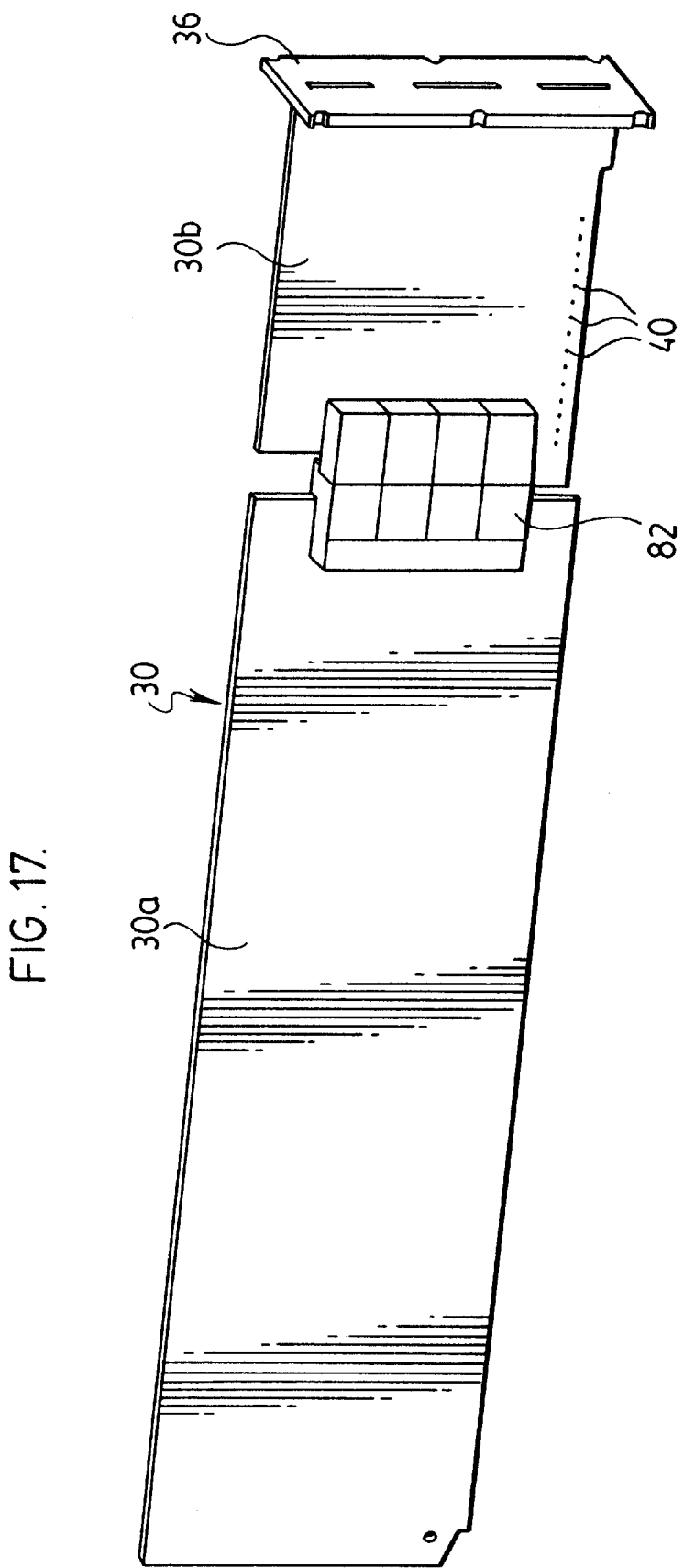
FIG. 17 is a perspective view of a still further preferred embodiment of a circuit board for the circuit board mounting system of the invention.

In embodiments utilizing dual circuit board device, illustrated in FIGS. 16 and 17, circuit board 30a is connected to the rear circuit board 30b by an interface adaptor 80 or 82 having connectors at each end that mate with the contacts or complimentary connectors along the rear edge of the front circuit board 30a and along the front edge of the rear circuit board 30b, to integrate the circuitry of the device. The interface adaptor may connect to the circuit board 30 transversely, as in the interface adaptor 80 shown in FIG. 16, or may connect to the circuit board 30 longitudinally as in the interface adaptor 82 shown in FIG. 17. Once the circuit boards 30a, 30b are connected to form an integral device these embodiments operates as in the previously described embodiment. (The external connectors have been omitted from FIGS. 16 and 17.)

Figure 21:
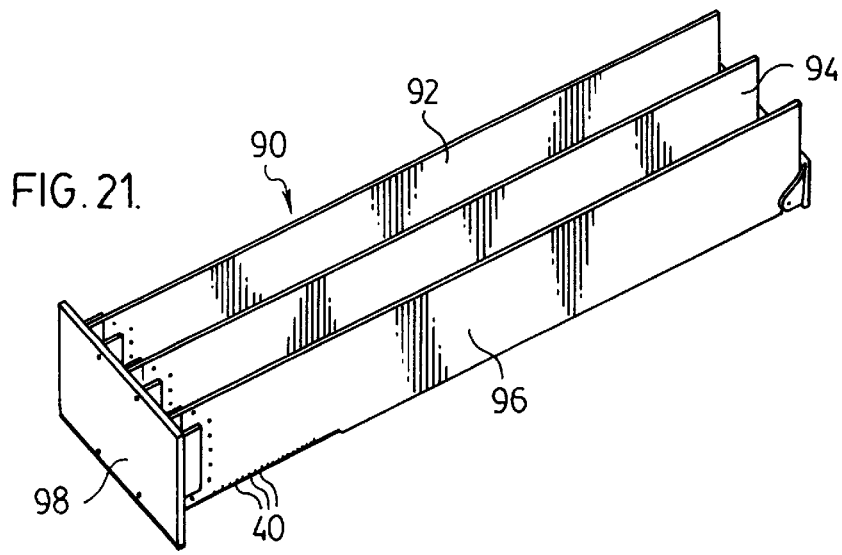
FIG. 21 is a perspective view of an integrated circuit board group for a mounting frame embodying the invention.
Figure 22:
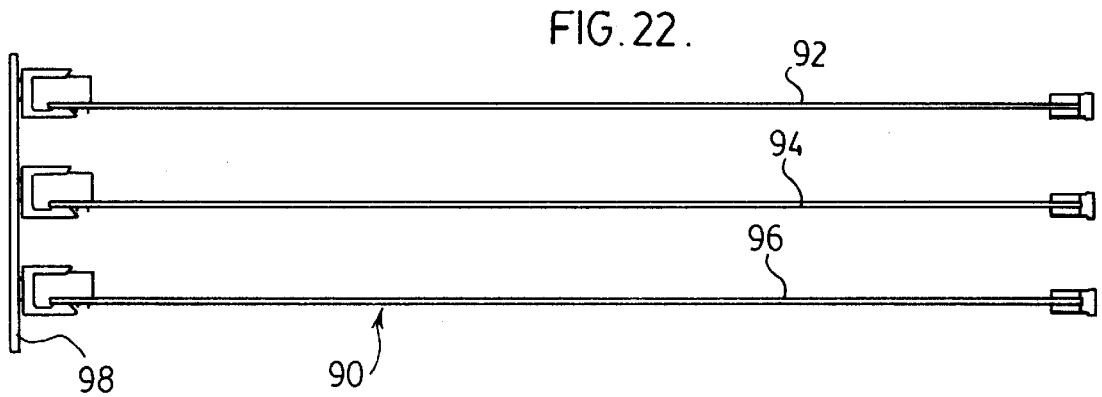
FIG. 22 is a top plan view of the circuit board group of FIG. 21, and FIGS. 23a to 23d are elevational views of connector plates embodying examples of various types of cable connectors.
Figure 23A:
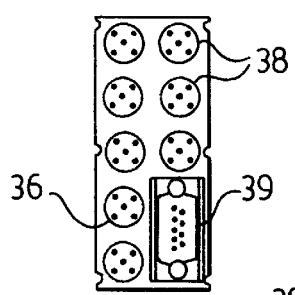
Figure 23B:
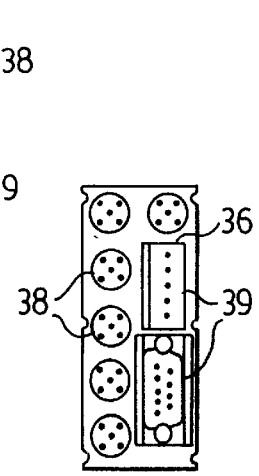
Figure 23C:
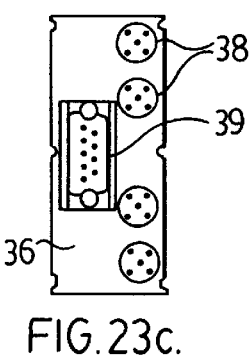
Figure 23D:
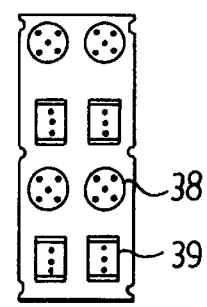

FIGS. 21 and 22 illustrate a circuit board group or cluster 90 adapted for occupying multiple compartments within the mounting frame 10 of FIG. 12. The circuit board cluster 90 comprises circuit boards 92, 94 and 96 which may, for example, respectively support circuitry for video, audio and data. The circuit boards 92, 94 and 96 are integrated into a cluster by a local back plane 98 (cable connectors not shown) which provides localized group busses for intercommunication between the circuit boards 92, 94 and 96. One or more of the circuit boards 92, 94 and 96 may also be provided with rows of contacts 40 for connection to the backplane 72 to integrate the circuit board cluster 90 into the circuitry of the mounting frame 10 through connectors 50 as hereinbefore described.

Figure 19:
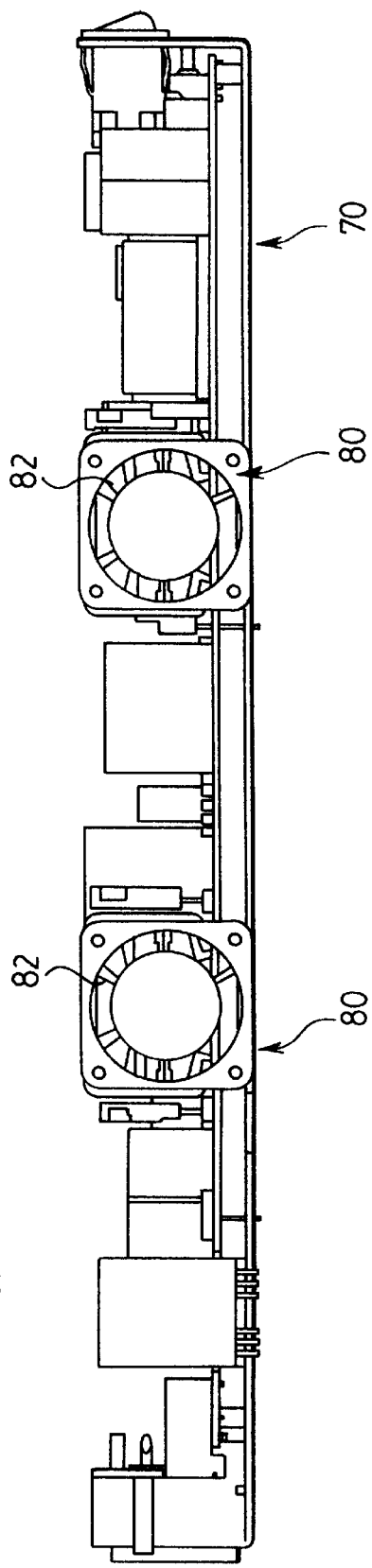
FIG. 19 is a side elevation of a chassis for a mounting frame embodying the invention.
Figure 20:
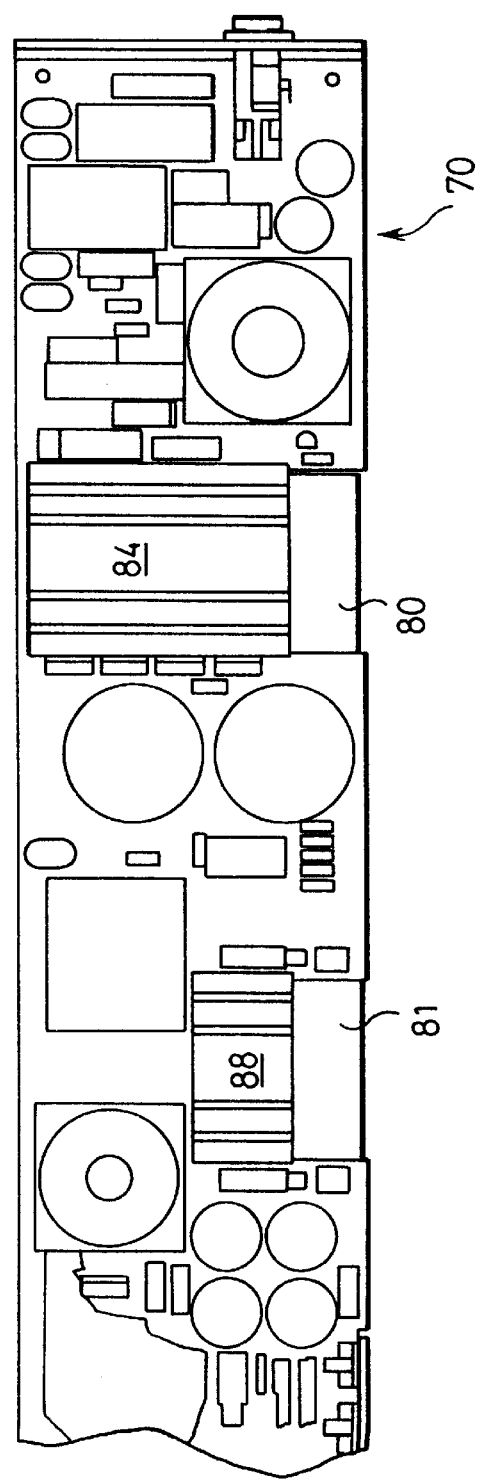
FIG. 20 is a partial top plan view of the chassis of FIG. 19 showing a preferred embodiment of a cooling system for a mounting frame embodying the invention.

FIGS. 19 and 20 illustrate a preferred cooling system for the mounting frame of the invention. At least one fan 80 is mounted on a chassis 70 which preferably also supports one or more power supplies and other components common to the mounting frame 10 and connected to the circuit boards 30 via the back plane 72. The chassis 70 is preferably mounted into an end compartment 18, providing a direct route to the exterior of the mounting frame 10 through vents 74 to avoid drawing warm air over the circuit boards 30.

A heat sink tunnel 84 in the form of a cylindrical or inverted "U"-shaped heat sink is disposed in alignment with the impeller 82, and in the preferred embodiment the highest heat generating components are mounted to the heat sink tunnel 84. The interior opening through the heat sink tunnel 84 preferably approximates the diameter of the impeller 82, and thus there is negligible resistance to air driven out of the mounting frame 10 by the fan 80. At the same time, the output airstream efficiently draws heat from the heat sink tunnel 84, to cool the most thermally problematic of the mounting frame components.

The intake airstream draws air from the remainder of the mounting frame interior, through vents provided in the bottom of the mounting frame 10 as shown to supply a source of fresh air to the interior of the mounting frame 10 (or in the case of the horizontally mounted circuit boards in the mounting frame 10 of FIG. 18, side-mounted vents 76 provide the fresh air supply). In the preferred embodiment all high heat-generating components on the circuit boards 30 are located so as to be in the strongest air flow path, in direct alignment with the impeller 82, to maximize cooling efficiency. In the preferred embodiment a secondary fan 86 may also provided, depending upon the number of heat-generating components in any particular case, expelling air into a second heat sink tunnel 88.

A preferred embodiment of the invention having been thus described by way of example only, it will be apparent to those skilled in the art that certain modifications and adaptations may be made without departing from the scope of the invention, as set out in the appended claims. Without limiting the foregoing, it will be appreciated that the invention has been described in the context of electronic audio/video equipment, however the principles and structures used therein are equally applicable to other types of electronic equipment and the invention is not intended to be limited to the particular embodiments described and shown.

The embodiments of the invention in which an exclusive property or privilege is claimed are defined as follows:

1. A circuit board mounting system for mounting at least one circuit board, comprising a mounting frame having at least one compartment, the compartment having at least a first track provided with a slot in a longitudinal direction for slidably receiving a circuit board, at least one opening through an end of the mounting frame for exposing a rear end of the circuit board supporting at least one external connector, and an internal connector comprising a plurality of pins disposed in the longitudinal direction for engaging against a plurality of contacts disposed adjacent to an edge of the circuit board adjoining the rear edge, and a housing comprising a slot aligned in the longitudinal direction with the slot in the first track, the internal connector being actuable between an open position in which the pins recede into the housing to disengage from the contacts and a closed position in which the pins impinge into the slot in the connector to engage the contacts, wherein the circuit board can be inserted into the connector in the longitudinal direction with the connector in the open position, and when the connector is actuated to the closed position the contacts are engaged by the pins of the internal connector and the external connector is accessible through the opening in the mounting frame.

2. The mounting system of claim 1 wherein the internal connector is actuable to disengage the pins from the contacts by a cam strip movable longitudinally between the closed position in which the pins engage the contacts and the open position in which the pins are disengaged from the contacts.

3. The mounting system of claim 2 wherein the first track is slidably mounted in the mounting frame and the cam strip is engaged to the first track and actuable between the closed and open positions by movement of the first track.

4. The mounting system of claim 3 in which the first track is actuated by a rotary knob having a portion which obstructs movement of the circuit board unless the knob is rotated to open the internal connector.

5. The mounting system of claim 1 comprising a second track disposed in opposition to the first track.

6. A circuit board mounting system, comprising a circuit board having a rear end supporting at least one external connector comprising a first adaptor portion, a mounting frame having at least one compartment, the compartment having at least one track extending in a longitudinal direction for slidably receiving the circuit board, at least one opening through a rear end of the mounting frame for exposing the rear end of the circuit board, a connector plate supporting at least one cable connector on an exterior face and supporting at least one second adaptor portion on an interior face electrically coupled to the cable connector, the connector plate being disposed over the opening, and an internal connector comprising a plurality of pins disposed in the longitudinal direction for engaging against a plurality of contacts disposed adjacent to an edge of the circuit board adjoining the rear end, the internal connector being actuable between an open position in which the pins recede into the housing to disengage from the contacts and a closed position in which the pins engage the contacts, wherein the circuit is inserted into the connector in the longitudinal direction such that, the first adaptor portion is coupled to the second adaptor portion to electrically couple an electrical circuit supported by the circuit board to the cable connector and the internal connector is actuated to the closed position to engage the pins to the contacts.

7. The mounting system of claim 6 wherein the track is provided with a longitudinal slot for receiving the circuit board, and the internal connector is provided with a slot in alignment with the slot in the track.

8. The mounting system of claim 7 wherein the internal connector is actuable to disengage the pins from the contacts by a cam strip movable longitudinally between a closed position in which the pins engage the contacts and an open position in which the pins are disengaged from the contacts.

9. The mounting system of claim 8 wherein when disengaged from the contacts the pins recede into a housing of the internal connector.

10. The mounting system of claim 8 wherein the first track is slidably mounted in the mounting frame and the cam strip is engaged to the track so as to be actuable by movement of the track.

11. The mounting system of claim 10 in which the track is actuated by a rotary knob having a portion which obstructs longitudinal movement of the circuit board unless the knob is rotated to open the internal connector.

12. The mounting system of claim 7 comprising a second track disposed in opposition to the first track.

13. The mounting system of claim 6 wherein the circuit board comprises a plurality of external connectors.

14. The mounting system of claim 6 wherein the external connectors each comprise a first portion of an adaptor, the mounting frame further comprising a connector plate supporting a second portion of the adaptor for coupling to each first portion, the second portion being electrically coupled to a cable connector supported on an exterior face of the connector plate.

* * * * *